(12) United States Patent
Zhong

(10) Patent No.: US 7,169,676 B1
(45) Date of Patent: Jan. 30, 2007

(54) SEMICONDUCTOR DEVICES AND METHODS FOR FORMING THE SAME INCLUDING CONTACTING GATE TO SOURCE

(75) Inventor: Huicai Zhong, Wappingers Falls, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 72 days.

(21) Appl. No.: 11/135,711

(22) Filed: May 23, 2005

(51) Int. Cl.
*H01L 21/336* (2006.01)
*H01L 21/425* (2006.01)

(52) U.S. Cl. ............ 438/302; 438/303; 438/305; 438/525; 257/E21.438; 257/E21.507; 257/E21.626

(58) Field of Classification Search ............ 438/525, 438/302, 303, 305; 257/E21.438, E21.507, 257/E21.626
See application file for complete search history.

(56) References Cited

U.S. PATENT DOCUMENTS

| | | | |
|---|---|---|---|
| 5,880,022 A * | 3/1999 | Lee et al. | 438/639 |
| 6,194,276 B1 * | 2/2001 | Chan et al. | 438/294 |
| 6,207,519 B1 * | 3/2001 | Kim et al. | 438/303 |
| 6,248,627 B1 * | 6/2001 | Pham et al. | 438/257 |
| 6,251,762 B1 * | 6/2001 | Jan et al. | 438/592 |
| 6,806,126 B1 * | 10/2004 | Luning et al. | 438/184 |
| 6,815,300 B2 * | 11/2004 | Jeong et al. | 438/305 |
| 2002/0025644 A1 * | 2/2002 | Cho et al. | 438/305 |
| 2005/0020022 A1 * | 1/2005 | Grudowski | 438/305 |

* cited by examiner

*Primary Examiner*—Michael Lebentritt
*Assistant Examiner*—Ron Pompey
(74) *Attorney, Agent, or Firm*—Ingrassia Fisher & Lorenz, P.C.

(57) ABSTRACT

Semiconductors having electrically coupled gate and impurity doped regions and methods for fabricating the same are provided. A method in accordance with an embodiment of the invention comprises forming a gate electrode overlying a substrate and an impurity doped region within the substrate. A first spacer is formed on a first side and a second spacer on a second side of the gate electrode. An ion is implanted into the first spacer with an angle greater than zero from an axis perpendicular to the surface of the substrate. The first spacer is etched to remove a portion thereof and a silicon film is deposited overlying a remainder of the first spacer, the impurity doped region and the second spacer. The silicon film is etched, forming a silicon spacer, and a silicide-forming metal is deposited to form a silicide contact that electrically couples the gate electrode and the impurity doped region.

15 Claims, 6 Drawing Sheets

SEMICONDUCTOR DEVICES AND METHODS FOR FORMING THE SAME INCLUDING CONTACTING GATE TO SOURCE

FIELD OF THE INVENTION

The present invention generally relates to semiconductor devices and methods for fabricating semiconductor devices, and more particularly relates to field effect transistors having electrically coupled gate and impurity doped regions.

BACKGROUND OF THE INVENTION

The majority of present day integrated circuits (ICs) are implemented by using a plurality of interconnected field effect transistors (FETs), also called metal oxide semiconductor field effect transistors (MOSFETs), or simply MOS transistors. An MOS transistor includes a gate electrode as a control electrode and spaced apart source and drain electrodes between which a current can flow. A control voltage applied to the gate electrode controls the flow of current through a channel between the source and drain electrodes. As the complexity of the integrated circuits increases, more and more MOS transistors are needed to implement the integrated circuit function. As more and more transistors are designed into the IC, it becomes important to shrink the size of individual MOS transistors so that the size of the IC remains reasonable and the IC can be reliably manufactured.

During IC fabrication, a contact is made to the gate electrode, the source electrode, and the drain electrode to access the transistor and allow interconnections between the transistor and other devices of the IC. A contact is an opening through one or more insulating layers that is subsequently filled with a conductive material that forms a contact to a device region. The conductive material forming the contact, which often takes the form of a plug, may be tungsten or other metals. However, as the size of transistors decreases, fabrication of the contacts to a transistor within the tolerances allowed by the relevant design rules becomes more difficult. Often the gate electrode and either the drain electrode or the source electrode are maintained at or regulated by the same voltage level, thus making one of the three contacts redundant. It is therefore advantageous to eliminate redundancy of contacts to reduce device size.

Accordingly, it is desirable to provide a semiconductor device utilizing only one contact to regulate the voltage of both the gate electrode and one of the drain or source electrode. In addition, it is desirable to provide a method for fabricating a field effect transistor that allows small feature size by electrically coupling the drain or source electrode and the gate electrode. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A method for fabricating a semiconductor device in accordance with an embodiment of the invention comprises forming a polycrystalline silicon gate electrode overlying a surface of a silicon substrate. The gate electrode has a first side and a second side. An impurity doped region is formed in the silicon substrate in self alignment with the gate electrode. A first spacer is formed on the first side and a second spacer is formed on the second side. An impurity ion is implanted selectively into the first spacer with an angle greater than zero from an axis perpendicular to the surface of the silicon substrate. The ion implanted first spacer is etched to remove a portion thereof and a silicon film is deposited overlying a remainder of the first spacer, the impurity doped region, and the second spacer. The silicon film is anisotropically etched to form a first silicon spacer disposed proximate to the first side of the gate electrode. A portion of the gate electrode and at least a portion of the impurity doped region are exposed and a silicide-forming metal is deposited on the exposed portion of the gate electrode, the at least a portion of the impurity doped region, and the first silicon spacer to form a silicide contact that electrically couples the gate electrode and the impurity doped region.

A method for fabricating a semiconductor device in accordance with another embodiment of the invention comprises forming a polycrystalline silicon gate electrode overlying a semiconductor substrate. The gate electrode has a first side and a second side. An impurity doped region is formed within the semiconductor substrate. A first spacer is formed on the first side and a second spacer is formed on the second side of the gate electrode. An impurity ion is selectivity implanted into at least a portion of the first spacer with an angle greater than zero from an axis that is perpendicular to a surface of the semiconductor substrate. The first spacer is etched to remove at least the impurity ion-implanted portion of the first spacer. A portion of the gate electrode and at least a portion of the impurity doped region are exposed and a silicide-forming metal is deposited on the exposed portion of the gate electrode, along the first side of the gate electrode and on the at least a portion of the impurity doped region to form a silicide contact that electrically couples the gate electrode and the impurity doped region.

A semiconductor device in accordance with an embodiment of the invention comprises a semiconductor substrate and a gate electrode disposed overlying the semiconductor substrate. An impurity doped region is disposed within and on the semiconductor substrate and at least partially offset from the gate electrode. A silicide contact extends from the impurity doped region to the gate electrode and electrically couples the impurity doped region and the gate electrode. An insulating layer overlies the silicide contact and a conductive plug extends through the insulating layer to the silicide contact.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
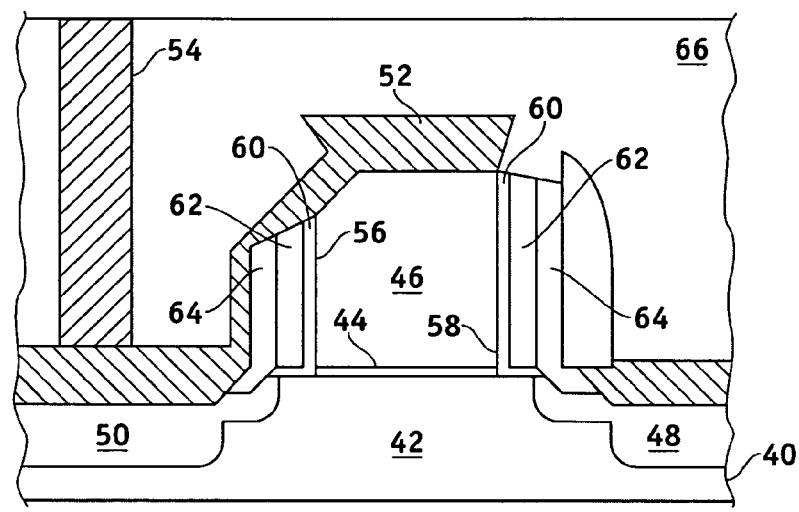
FIG. 1 illustrates schematically, in cross section, a semiconductor device in accordance with an exemplary embodiment of the invention.

FIG. 1 illustrates schematically, in cross section, an MOS transistor 40 in accordance with an embodiment of the invention. MOS transistor 40 includes a silicon substrate 42, or a layer of silicon on an insulating substrate, with a gate insulator 44 formed on the substrate surface. A gate electrode 46 is formed on the gate insulator. In an exemplary embodiment of the invention, a thin zero spacer 60 is disposed about a first side surface 56 and a second side surface 58 of gate electrode 46 and an offset spacer 62 is disposed proximate to the zero spacer 60. An oxide liner 64 is disposed proximate to the offset spacer 62 and proximate to first and second side surfaces 56, 58 of gate electrode 46. A source region 48 and a drain region 50 are formed in the silicon substrate by introducing appropriate impurity determining dopants such as arsenic or phosphorus for an N-channel MOS transistor or boron for a P-channel MOS transistor. Contact to the gate electrode 46 and the drain region 50 is made through a metal silicide layer 52 and a conductive plug 54. Conductive plug 54 is formed through openings in an insulator layer 66, which provides electrical isolation between transistor 40 and overlying layers of interconnecting metal. Metal silicide layer 52 extends from the drain region 50 along the side surface 56 of gate electrode 46 to the gate electrode 46. In this regard, the gate electrode 46 and the drain region 50 can be controlled utilizing one contact to the metal silicide layer 52, which electrically couples the gate electrode and the drain region. While in FIG. 1 metal silicide layer 52 electrically couples drain region 50 and gate electrode 46 of MOS transistor 40, it will be understood that, alternatively, metal silicide layer 52 may be formed to electrically couple gate electrode 46 and source region 48.

FIGS. 2–15 illustrate method steps for manufacturing a semiconductor device such an MOS transistor 140, similar to MOS transistor 40, in accordance with one embodiment of the invention. While FIGS. 2–15 illustrate a method for electrically coupling the gate electrode and a drain region of an MOS transistor, it will be appreciated that the method may be used to electrically couple the gate electrode and source region of an MOS transistor. Further, in the illustrated embodiment of FIGS. 2–15 MOS transistor 140 is an N-channel MOS transistor, although similar method steps can be used to manufacture a P-channel MOS transistor with appropriate changes in impurity determining dopant types. Likewise, similar method steps can be used to manufacture complementary MOS (CMOS) transistors. Various steps in the manufacture of MOS transistors are well known and so, in the interest of brevity, many conventional steps will only be mentioned briefly herein or will be omitted entirely without providing the well known process details. Although the term "MOS device" properly refers to a device having a metal gate electrode and an oxide gate insulator, that term will be used throughout to refer to any semiconductor device that includes a conductive gate electrode that is positioned over a gate insulator (whether oxide or other insulator) which, in turn, is positioned over a semiconductor substrate. MOS transistor 140 can be one of many transistors that are used to implement a complete semiconductor device such as a CMOS integrated circuit. Although illustrated with reference to MOS transistors, the invention is not limited to use in the fabrication of MOS integrated circuits, but instead is applicable to the fabrication of all types of semiconductor devices.

Figure 2:
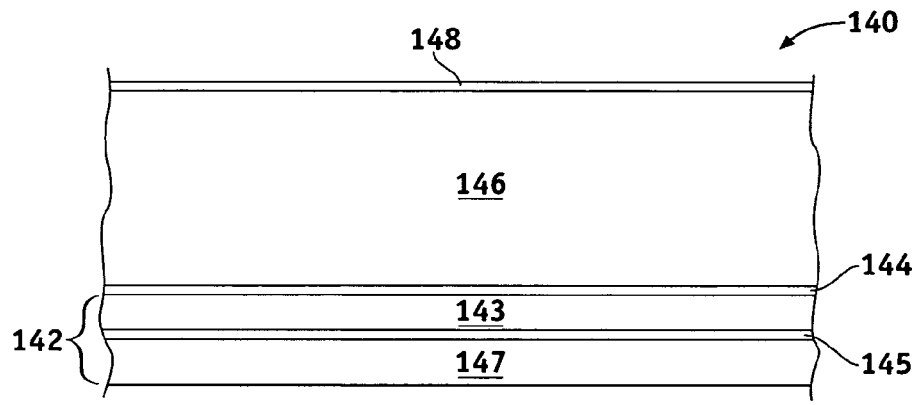
FIGS. 2–15 illustrate schematically, in cross section, method steps in accordance with an exemplary embodiment of the invention for fabricating the semiconductor device of FIG. 1.

As illustrated in FIG. 2, the manufacture of MOS transistor 140 in accordance with an embodiment of the invention begins with providing a semiconductor substrate 142. The semiconductor substrate is preferably a silicon substrate wherein the term "silicon substrate" is used herein to encompass the relatively pure silicon materials typically used in the semiconductor industry as well as silicon admixed with other elements such as germanium and the like. The term "semiconductor substrate" is also used to encompass the substrate itself together with metal or insulator layers that may overly the substrate. Silicon substrate 142 may be a bulk silicon wafer or a thin layer of silicon 143 on an insulating layer 145 (commonly know as a silicon-on-insulator wafer or SOI wafer) that, in turn, is supported by a silicon carrier wafer 147. A layer of gate insulator 144 is formed on the surface of silicon substrate 142. The gate insulator may be a thermally grown silicon dioxide formed by heating the silicon substrate in an oxidizing ambient, or may be a deposited insulator such as a silicon oxide, silicon nitride, silicon oxynitride, a high dielectric constant insulator such as HfSiO, or the like. Deposited insulators can be deposited by chemical vapor deposition (CVD), low pressure chemical vapor deposition (LPCVD), plasma enhanced chemical vapor deposition (PECVD), or atomic layer deposition (ALD). The gate insulator material is typically 1–10 nanometers (nm) in thickness. In accordance with one embodiment of the invention, a layer preferably of polycrystalline silicon 146 is deposited onto the layer of gate insulator. The layer of polycrystalline silicon can be deposited as an impurity doped layer, but is preferably deposited as undoped polycrystalline silicon and is subsequently impurity doped by ion implantation. A layer 148 of hard mask material such as silicon oxide, silicon nitride, or silicon oxynitride can be deposited onto the surface of the polycrystalline silicon to aid in subsequently patterning the polycrystalline silicon. The polycrystalline material can be deposited to a thickness of about 100 nm by LPCVD by the hydrogen reduction of silane ($SiH_4$). The hard mask material can be deposited to a thickness of about 50 nm, also by LPCVD.

Figure 3:
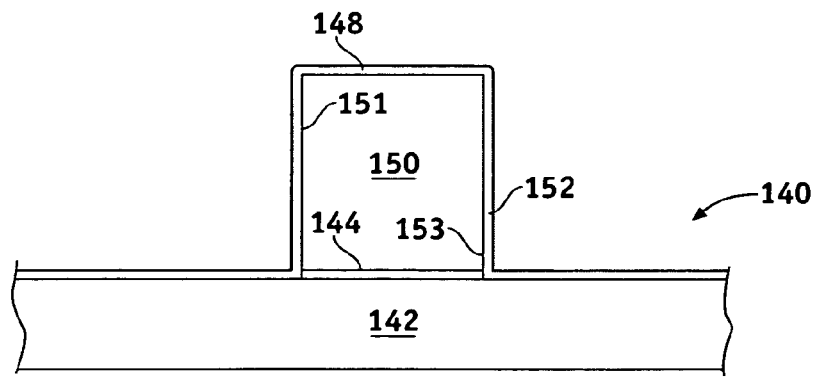

Hard mask layer 148, underlying layer of polycrystalline silicon 146 and underlying layer of gate insulator 144 are photolithographically patterned to form gate electrode 150 having side surfaces 151 and 153, as illustrated in FIG. 3. Preferably gate electrode 150 has a width equal to the minimum line width allowable by the design rules being used to design the integrated circuit of which MOS transistor 140 is a part. The polycrystalline silicon and gate insulator can be etched in the desired pattern by, for example, plasma etching in a Cl or $HBr/O_2$ chemistry and the hard mask can be etched, for example, by plasma etching in a $CHF_3$, $CF_4$, or $SF_6$ chemistry. Following the patterning of the gate electrode, a thin layer 152 of silicon oxide is thermally grown on the sidewalls of the gate electrode by heating the polycrystalline silicon in an oxidizing ambient. Layer 152 can be grown to a thickness of about 2–5 nm.

Figure 4:
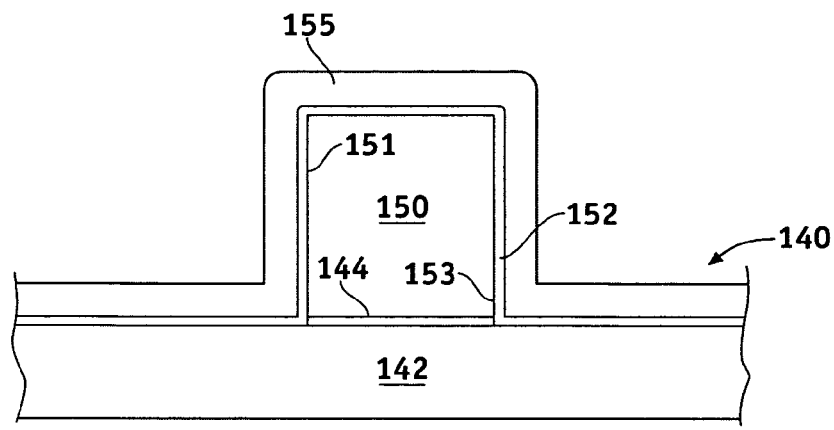
Figure 5:
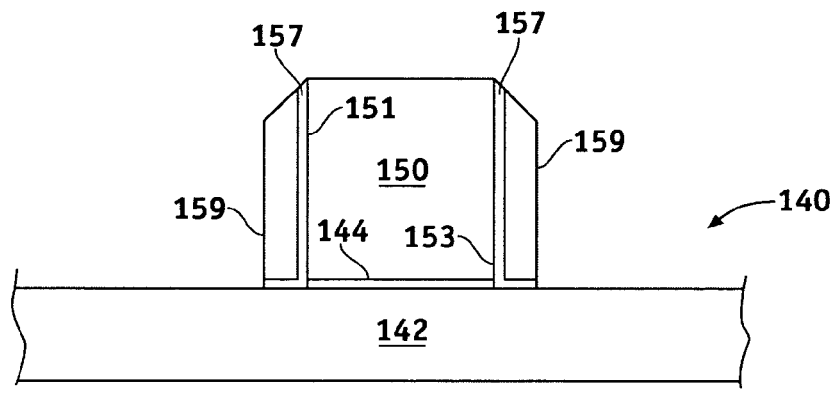

Referring to FIG. 4, after formation of the thin layer 152 of silicon oxide, a layer 155 of silicon oxide is deposited overlying thin layer 152. Silicon oxide layer 155 can be deposited to a thickness in the range of about 5–20 nm by CVD, LPCVD, PECVD, ALD, or any other suitable process. Following the deposition of silicon oxide layer 155, thin layer 152 and silicon oxide layer 155 are anisotropically etched, preferably by reactive ion etching (RIE) using $CHF_3$, $CF_4$, or $SF_6$ chemistry, to form zero spacers 157 disposed along side surfaces 151 and 153 of gate electrode 150 and offset spacers 159 disposed proximate to zero spacers 157, as illustrated in FIG. 5. Zero spacers 157 serve to protect the thin gate insulator that would otherwise be exposed at the edge of gate electrode 150. Zero spacers 157 also provide a barrier separating the polycrystalline silicon of gate electrode 150 from the material of offset spacers 159.

Figure 6:
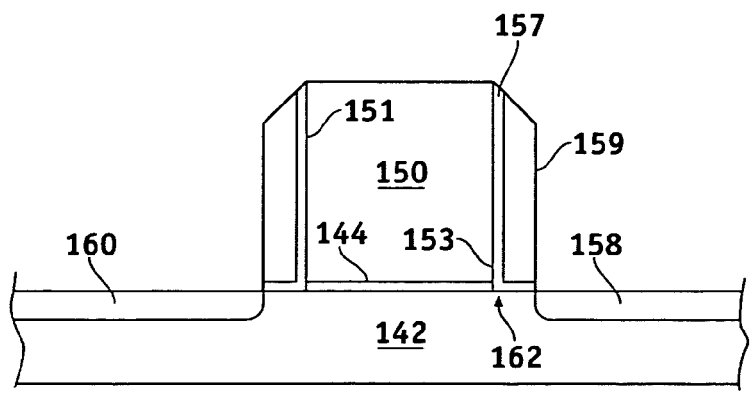

Gate electrode 150, zero spacers 157, and offset spacers 159 can be used as an ion implantation mask to form source 158 and drain 160 regions in silicon substrate 142, as illustrated in FIG. 6. By using the gate electrode, zero spacers 157, and offset spacers 159 as an ion implant mask, the source and drain regions and channel 162, defined as the substrate region between source 158 and drain 160 regions, are all self aligned with the gate electrode. For an N-channel MOS transistor the source and drain regions are preferably formed by implanting arsenic ions, although phosphorus ions could also be used. Source region 158 and drain region 160 are shallow and preferably have a junction depth of less than about 20 nm and most preferably less than about 5–10 nm and are heavily impurity doped to about 10 ohms per square.

Figure 7:
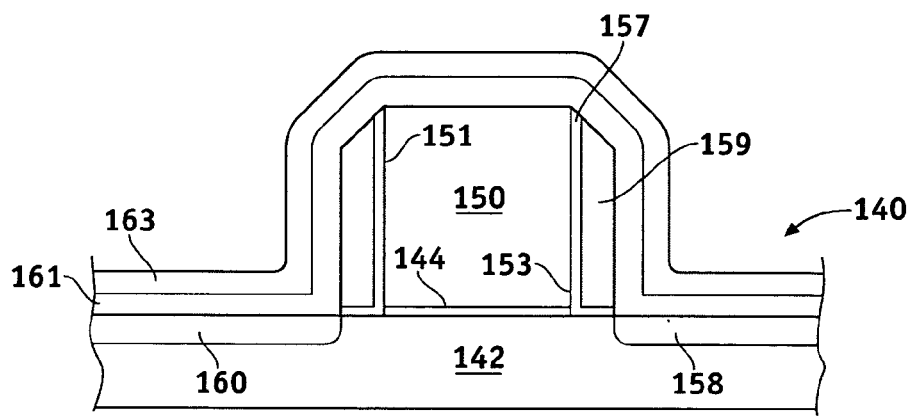

As illustrated in FIG. 7, a silicon oxide liner 161 having a thickness of about 1–5 nm, preferably about 2–3 nm, is globally deposited by CVD, LPCVD, PECVD, ALD, or any other suitable process over source region 158, zero spacers 157, offset spacers 159, gate electrode 150, and drain region 160. A layer 163 of spacer forming material, such as, for example, silicon nitride or a low dielectric constant material, then is deposited over silicon oxide liner 161. Layer 163 may be deposited to a thickness of about 20 to 60 nm by PECVD, LPCVD, or the like. As described in more detail below, silicon oxide liner 161 serves as an etch stop during the subsequent etching of layer 163.

Figure 8:
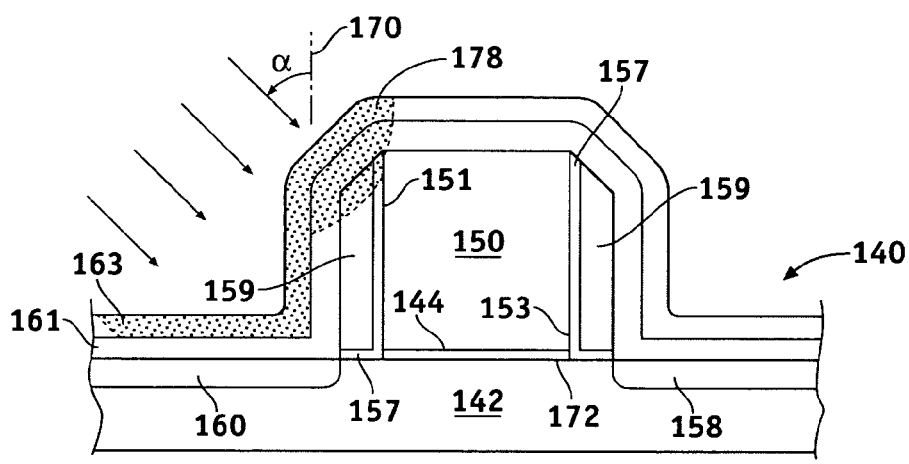

As illustrated in FIG. 8, following deposition of layer 163, MOS transistor 140 is subjected to an angled unidirectional ion implantation. Preferably, the angled unidirectional ion implantation is performed using ions of germanium (Ge), arsenic (As), phosphorous (P), boron (B), and the like. More preferably, the ion implantation uses germanium ions. The ions are directed at side surface 151 (i.e., the side surface closest to drain region 160) of MOS transistor 140 at an acute angle $\alpha$ from an axis 170 that is perpendicular to a surface 172 of semiconductor substrate 142. Preferably, angle $\alpha$ is at least as great as about 7 degrees and is less than about 90 degrees. In a preferred embodiment, the ions are implanted at an energy and at an angle $\alpha$ such that the ions are implanted into a portion of layer 163, a portion of silicon oxide liner 161, a portion of offset spacer 159 and, optionally, a portion of zero spacer 157 that are proximate side surface 151 to form implanted materials 178. For example, germanium ions can be implanted at an energy of about 30 KeV and at an implant dose of about $1 \times 10^{15}$ per square centimeter. The implanted ions cause a physical and/or chemical change in the implanted materials 178 that results in an increase in the etch rate of the materials. It will be appreciated that, because the ion implantation is unidirectional and is oriented at an angle, ions will be implanted into the area of MOS transistor 140 that is exposed to or facing the source of the ions. Accordingly, if more than one MOS transistor of an integrated circuit is to be subjected to the angled unidirectional ion implantation, the transistors are preferably similarly oriented so that the same regions of the MOS transistors receive the ions. Other devices or transistors of the integrated circuit that are not to be subjected to the unidirectional ion implantation may be covered with a suitable mask, such as a layer of photoresist. The angled implant is directed to the drain side of gate electrode 150 because it is intended to electrically couple the drain and gate regions; if, instead, the intent is to electrically couple the gate and source regions, the angled implant would be directed to the source side of gate electrode 150.

Figure 9:
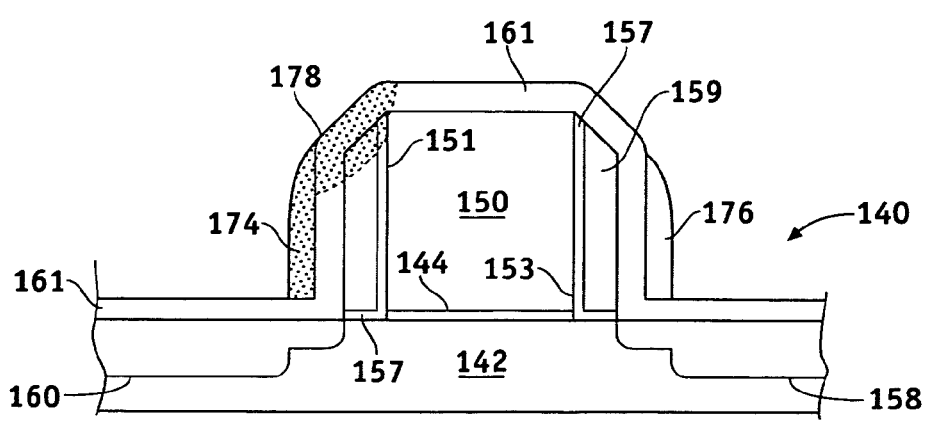

After the angled unidirectional ion implantation, layer 163 of spacer forming material then is anisotropically etched, for example by reactive ion etching (RIE) using a $CHF_3$, $CF_4$, or $SF_6$ chemistry, to form first sidewall spacers 174 disposed proximate to side surface 151 and second sidewall spacer 176 disposed proximate to side surface 153 of MOS transistor 140, as illustrated in FIG. 9. Gate electrode 150, zero spacers 157, offset spacers 159, oxide liner 161, and sidewall spacers 174 and 176 then can be used as an ion implantation mask to form a deeper source region 158 and a deeper drain region 160 in silicon substrate 142. Regions 158 and 160 thus will be self aligned with sidewall spacers 174 and 176, oxide liner 161, offset spacers 159, zero spacers 157, and the gate electrode. For an NMOS transistor, regions 158 and 160 can be formed by ion implanting ions of arsenic or phosphorous. The deeper source and drain regions help to insure that later formed silicide regions will not extend through the doped source and drain regions causing an electrical short to substrate 142. Although some integrated circuits fabrication processes may use additional spacers and additional implants into the source, drain, channel, or other regions, such additional process steps are not necessary to illustrate the invention and hence need not be shown.

Figure 10:
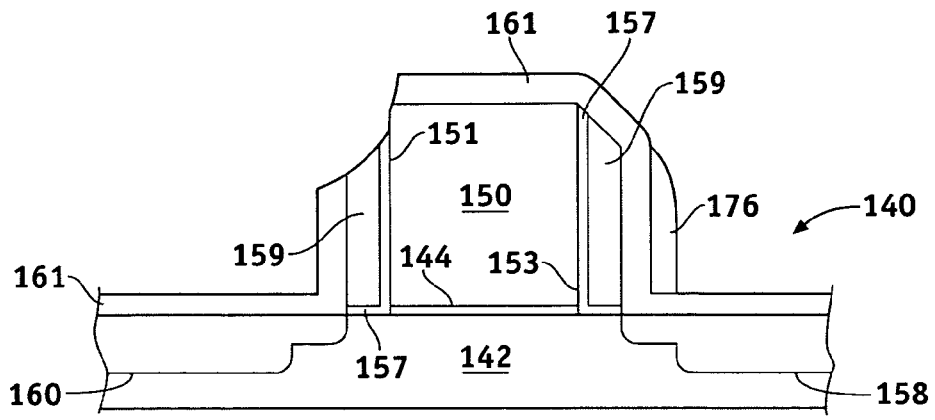

Following the deep implantation of regions 158 and 160, the portions of transistor 140 subjected to the angled unidirectional ion implantation, that is, implanted materials 178, are removed by wet etching in a hydrogen fluoride (HF)/ethylene glycol mixture or in diluted HF. As described above, the implanted ions cause a physical and/or chemical change in the implanted materials 178 that results in an increase in the etch rate of the implanted materials compared to the etch rate of the non-implanted materials. In this regard, substantially all of sidewall spacer 174 and the implanted portions of silicon oxide liner 161, offset spacer 159 and, optionally, zero spacer 157 proximate to side surface 151 are removed, as illustrated in FIG. 10, while the non-implanted portions of silicon oxide liner 161, offset spacer 159, and second sidewall spacer 176 are etched at a substantially slower rate.

Figure 11:
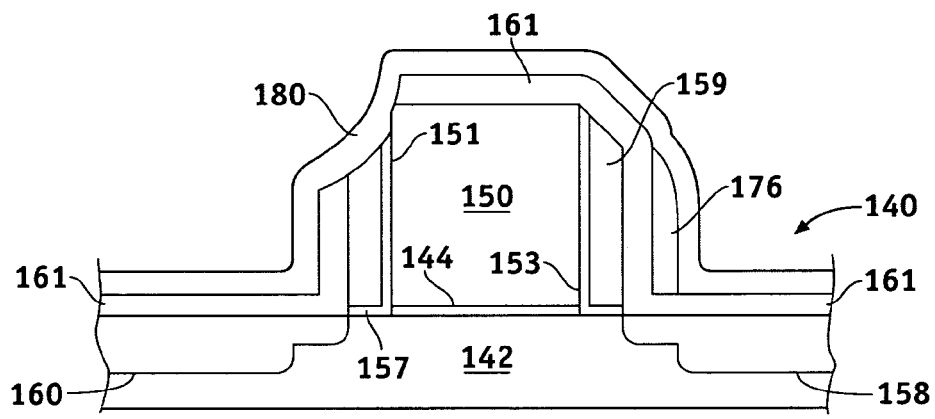
Figure 12:
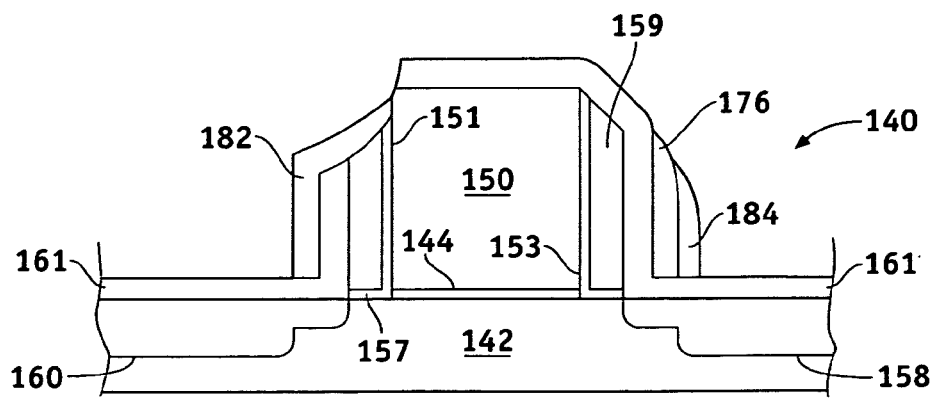

Referring to FIG. 11, a thick silicon layer 180, preferably formed of polycrystalline silicon, is globally deposited overlying MOS transistor 140. Silicon layer 180 may be deposited to a thickness in the range of about 30–60 nm by CVD, LPCVD, PVD, or any other suitable process. Referring to FIG. 12, silicon layer 180 then is anisotropically etched, for example, by RIE using a using a $CHF_3$, $CF_4$, or $SF_6$ chemistry, to form a first silicon spacer 182 disposed proximate to side surface 151 and second silicon spacer 184 disposed proximate to side surface 153. First silicon spacer 182 is formed along the vertical portion of oxide liner 161 and overlying the oxide liner 161, offset spacer 159 and zero spacer 157 proximate to side surface 151. The asymmetric etching of offset spacer 159, oxide liner 161 and layer 163 caused by the angled implantation allows first silicon spacer 182 to be formed in partial contact with gate electrode 150 while second silicon spacer 184 is spaced apart from gate electrode 150.

Figure 13:
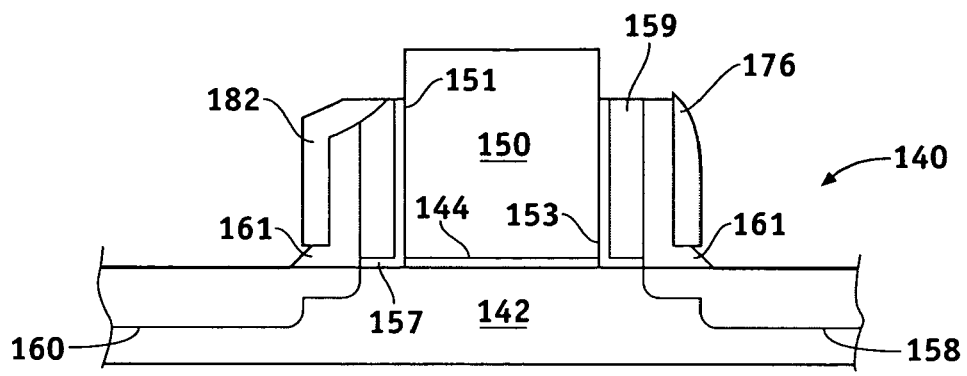
Figure 14:
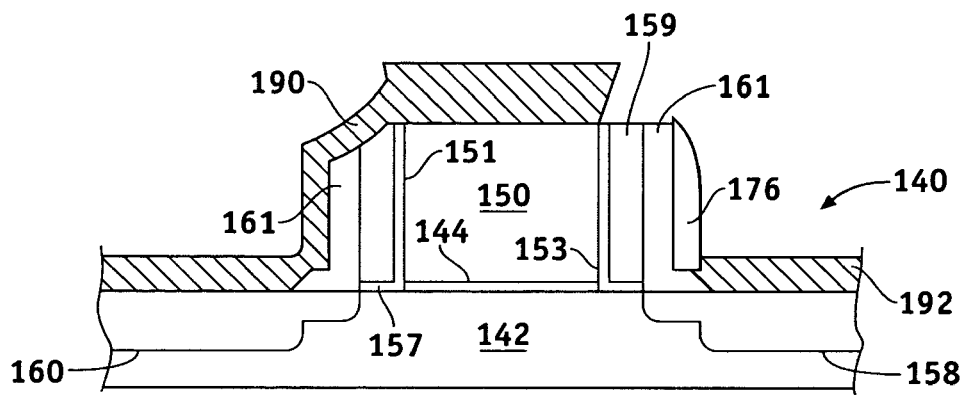

Referring to FIG. 13, after the anisotropic etching of silicon layer 180, MOS transistor 140 is subjected to a cleaning process to remove exposed regions of oxide liner 161, thus exposing gate electrode 150. The cleaning process preferably utilizes diluted hydrogen fluoride (HF) in ethylene glycol or buffered HF (BHF), which may result in the etching of first silicon spacer 182, second silicon spacer 184, offset spacers 159, and zero spacers 157 in addition to oxide liner 161. A layer of silicide forming metal is globally deposited onto MOS transistor 140 and is heated, for example by rapid thermal annealing (RTA), to form a first metal silicide contact 190, which extends from a top portion of the drain region 160, proximate to side surface 151 of gate electrode 150, and to gate electrode 150, as illustrated in FIG. 14. A second metal silicide contact 192 also is formed at the top of source region 158. The silicide forming metal can be, for example, cobalt, nickel, rhenium, ruthenium, or palladium, and preferably is cobalt or nickel or nickel plus about 5% platinum. The silicide forming metal can be deposited, for example, by sputtering to a thickness of about 30–50 nm. The RTA causes the formation of metal silicide anywhere the silicide forming metal is in contact with exposed silicon. Any silicide forming metal that is not in contact with exposed silicon, for example the silicide forming metal that is deposited on sidewall spacer 176, does not react during the RTA to form a silicide and may subsequently be removed by wet etching in an $H_2O_2/H_2SO_4$ or $HNO_3/HCl$ solution. Sidewall spacer 176 and the offset spacer 159 and the oxide liner 161 proximate to side surface 153 restrict the formation of second metal silicide contact 192 so that the metal silicide formed on the source region does not contact gate electrode 150, which would cause an electrical short between the gate electrode and the source region.

Figure 15:
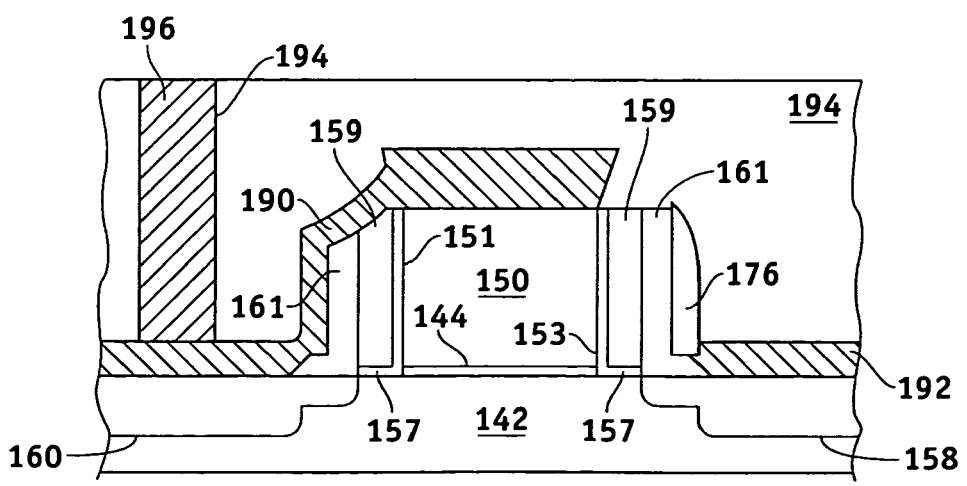

As illustrated in FIG. 15, a layer of dielectric insulating material 194 is deposited and subsequently photolithographically patterned and etched to form opening 196 extending through the insulating material 194 and exposing a portion of first metal silicide contact 190 on drain region 160. The insulating layer may be planarized by a chemical mechanical planarization (CMP) process before patterning. Conductive plug 198 is then formed in opening 196 so that the drain region 160 can be appropriately electrically connected to other devices in the integrated circuit to implement the desired circuit function. Because first metal silicide contact 190 electrically couples drain region 160 and gate electrode 150, gate electrode 150 also is electrically connected to the devices of the integrated circuit to which drain region 160 is connected without requiring a separate conductive plug connected directly to gate electrode 150. Conductive plug 198 is typically formed of tungsten, although other metals can also be used.

Figure 16:
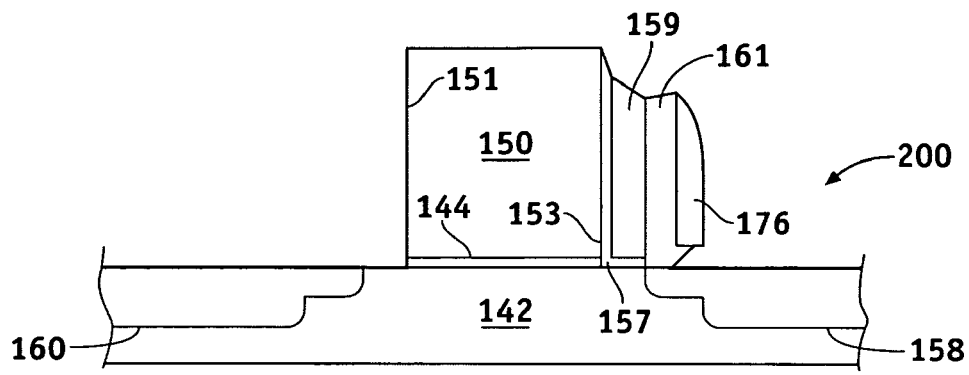
FIGS. 16–18 illustrate schematically, in cross section, method steps in accordance with another exemplary embodiment of the invention for fabricating a semiconductor device.
Figure 17:
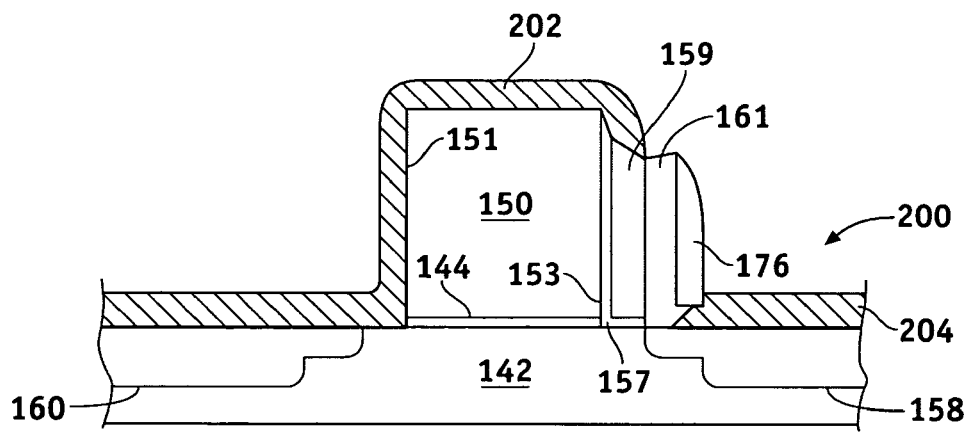
Figure 18:
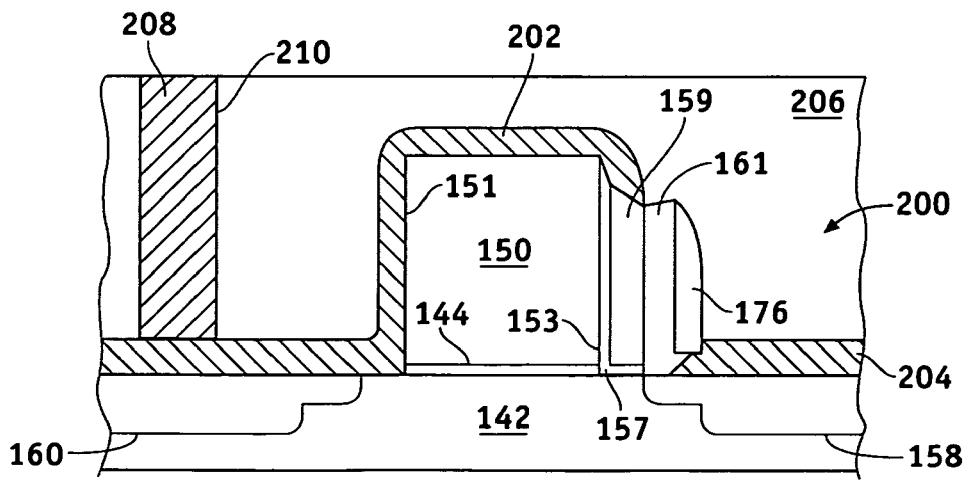

FIGS. 16–18 illustrate method steps for manufacturing a semiconductor device, such as an MOS transistor 200, in accordance with another embodiment of the invention. MOS transistor 200 is similar to MOS transistor 140 illustrated in FIG. 15, with like reference numbers referring to like elements. The method begins as described above, utilizing the same steps as illustrated in FIGS. 2–10. While FIGS. 2–10 and 16–18 illustrate a method for electrically coupling the gate electrode and a drain region of an MOS transistor, it will be appreciated that the method may be used to electrically couple the gate electrode and source region of an MOS transistor. Further, while in the illustrated embodiment of FIGS. 2–10 and 16–18 the MOS transistor fabricated by the method steps is an N-channel MOS transistor, similar method steps can be used to manufacture a P-channel MOS transistor with appropriate changes in impurity determining dopant types. Likewise, similar method steps can be used to manufacture complementary MOS (CMOS) transistors.

Following performance of the steps described above with reference to FIGS. 2–10, MOS transistor 200 is subjected to a cleaning process to remove exposed regions of oxide liner 161, thus exposing gate electrode 150 and drain region 160, as illustrated in FIG. 16. The cleaning process preferably utilizes diluted HF in ethylene glycol or BHF, which may result in the etching and/or removal of the offset spacer 159 and the zero spacer 157 disposed proximate to side surface 151 of gate electrode 150. The cleaning process also may result in some etching of the oxide liner 161, the offset spacer 159 and the zero spacer 157 disposed between gate electrode 150 and sidewall spacer 176.

Referring to FIG. 17, a layer of silicide forming metal is globally deposited onto MOS transistor 200 and is heated, for example by rapid thermal annealing (RTA), to form a first metal silicide contact 202, which extends from a top portion of the drain region 160, along side surface 151 of gate electrode 150, and to a top portion of the gate electrode 150. A second metal silicide contact 204 also is formed at the top of source region 158. The silicide forming metal can be, for example, cobalt, nickel, rhenium, ruthenium, or palladium, and preferably is cobalt or nickel or nickel plus about 5% platinum. The silicide forming metal can be deposited, for example, by sputtering to a thickness of about 30–50 nm. The RTA causes the formation of metal silicide anywhere the silicide forming metal is in contact with exposed silicon. Any silicide forming metal that is not in contact with exposed silicon, for example the silicide forming metal that is deposited on sidewall spacer 176, does not react during the RTA to form a silicide and may subsequently be removed by wet etching in an $H_2O_2/H_2SO_4$ or $HNO_3/HCl$ solution. The sidewall spacer 176, the offset spacer 159, and the oxide liner 161 proximate to side surface 153 restrict the formation of second metal silicide contact 204 so that the metal silicide formed on the source region does not contact gate electrode 150, which would cause an electrical short between the gate electrode and the source region.

As illustrated in FIG. 18, a layer of dielectric insulating material 206 is deposited and subsequently photolithographically patterned and etched to form opening 210 extending through the insulating material 206 and exposing a portion of first metal silicide contact 202 on drain region 160. The insulating layer may be planarized by a chemical mechanical planarization (CMP) process before patterning. Conductive plug 208 is then formed in opening 210 so that the drain region 160 can be appropriately electrically connected to other devices in the integrated circuit to implement the desired circuit function. Because first metal silicide contact 202 electrically couples drain region 160 and gate electrode 150, gate electrode 150 also is electrically connected to the devices of the integrated circuit to which drain region 160 is connected without requiring a separate conductive plug connected directly to gate electrode 150. Conductive plug 208 is typically formed of tungsten, although other metals can also be used.

Large scale integrated circuits typically include several levels of interconnect metallization. To implement a desired circuit function, appropriate contact must be made between selected device regions on one of those interconnect metallization levels and other selected device regions on other interconnect metallization levels. Although the invention has been described and illustrated with specific examples in which contact has been made by a plug extending through a dielectric layer to contact a drain region of an MOS transistor, the invention is equally applicable to forming a contact to a source region that is electrically coupled to a gate electrode, or to a gate electrode that is electrically coupled to a drain or source region.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a semiconductor device, the method comprising the steps of:
   forming a polycrystalline silicon gate electrode overlying a surface of a silicon substrate, said gate electrode having a first side and a second side;
   forming an impurity doped region in said silicon substrate in self alignment with said gate electrode;
   forming a first spacer on said first side and a second spacer on said second side;
   implanting an impurity ion selectively into said first spacer with an angle greater than zero from an axis perpendicular to said surface of said silicon substrate;
   etching said ion implanted first spacer to remove a portion thereof;
   depositing a silicon film overlying a remainder of said first spacer, said impurity doped region, and said second spacer;
   anisotropically etching said silicon film to form a first silicon spacer disposed proximate to said first side of said gate electrode;
   exposing a portion of said gate electrode and at least a portion of said impurity doped region; and
   depositing a silicide-forming metal on said exposed portion of said gate electrode, said at least a portion of said impurity doped region, and said first silicon spacer to form a silicide contact that electrically couples said gate electrode and said impurity doped region.

2. The method of claim 1, wherein the step of implanting comprises the step of implanting said impurity ion that is unidirectional and is directed at said first spacer at an angle no less than about 7 degrees from said axis.

3. The method of claim 1, wherein the step of implanting comprises the step of implanting ions that comprise a material selected from the group consisting of germanium (Ge), arsenic (As), phosphorous (P), and boron (B).

4. The method of claim 3, wherein the step of implanting comprises the step of implanting germanium ions at an energy of about 30 KeV and at an implant dose of about $1 \times 10^{15}$ per square centimeter.

5. The method of claim 1, wherein the step of exposing comprises the step of etching a silicon oxide layer overlying said gate electrode and said at least a portion of said impurity doped region.

6. The method of claim 1, wherein the step of forming an impurity doped region comprises forming a drain region.

7. The method of claim 1, wherein the step of depositing a silicide-forming metal comprises the step of depositing a metal comprising cobalt or nickel.

8. A method for fabricating a semiconductor device, the method comprising the steps of:
   forming a polycrystalline silicon gate electrode overlying a semiconductor substrate, said gate electrode having a first side and a second side;
   forming an impurity doped region within said semiconductor substrate;
   forming a first spacer on said first side and a second spacer on said second side;
   implanting an impurity ion selectivity into at least a portion of said first spacer with an angle greater than zero from an axis that is perpendicular to a surface of said semiconductor substrate;
   etching said first spacer to remove at least said impurity ion-implanted portion of said first spacer;
   exposing a portion of said gate electrode and at least a portion of said impurity doped region; and
   depositing a silicide-forming metal on said exposed portion of said gate electrode, along said first side of said gate electrode and on said at least a portion of said impurity doped region to form a silicide contact that electrically couples said gate electrode and said impurity doped region.

9. The method of claim 8, wherein the step of implanting comprises implanting ions that are selected from the group consisting of germanium (Ge) ions, arsenic (As) ions, phosphorous (P) ions, and boron (B).

10. The method of claim 9, wherein the step of implanting comprises implanting germanium ions at an energy of about 30 KeV and at an implant dose of about $1 \times 10^{15}$ per square centimeter.

11. The method of claim 8, wherein the step of implanting comprises the step of implanting said impurity ion that is unidirectional and is directed at said first spacer at an angle no less than about 7 degrees from said axis.

12. The method of claim 8, wherein the step of forming an impurity doped region comprises forming a drain region.

13. The method of claim 8, wherein the step of exposing comprises the step of etching a silicon oxide layer overlying said gate electrode.

14. The method of claim 8, wherein the step of forming a first spacer and a second spacer comprises the step of forming a first offset spacer proximate to said first side of said gate electrode and a second offset spacer proximate to said second side of said gate electrode, and wherein the step of forming a first offset spacer and a second offset spacer is performed after the step of forming a polycrystalline silicon gate electrode and before the step of forming an impurity doped region.

15. The method of claim 14, further comprising the step of forming a first zero spacer proximate to said first side of said gate electrode and a second zero spacer proximate to said second side of said gate electrode, wherein the step of forming a first zero spacer and a second zero spacer is performed after the step of forming a polycrystalline silicon gate electrode and before the step of forming a first offset spacer and a second offset spacer.

* * * * *